United States Patent
Koga et al.

(10) Patent No.: US 7,710,582 B2
(45) Date of Patent: May 4, 2010

(54) LASER PROCESSING APPARATUS AND LASER PROCESSING METHOD FOR CUTTING AND REMOVING A PART OF A SURFACE REGION OF A SUBSTRATE

(75) Inventors: Norihisa Koga, Kikuchi-gun (JP); Shinji Koga, Kikuchi-gun (JP); Naoto Yoshitaka, Kikuchi-gun (JP); Akira Nishiya, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 1201 days.

(21) Appl. No.: 11/258,281

(22) Filed: Oct. 26, 2005

(65) Prior Publication Data

US 2006/0092990 A1 May 4, 2006

(30) Foreign Application Priority Data

Oct. 29, 2004 (JP) .............................. 2004-316559

(51) Int. Cl.
*G01B 11/30* (2006.01)

(52) U.S. Cl. .................................... 356/600; 219/121.6

(58) Field of Classification Search ......... 356/624–625, 356/630, 237.5, 609, 600, 601; 219/121.6, 219/121.67, 121.78–121.83; 250/559.22, 250/559.26, 559.27, 559.3, 559.19; 438/7, 438/16

See application file for complete search history.

(56) References Cited

U.S. PATENT DOCUMENTS

| 5,448,332 | A | * | 9/1995 | Sakakibara et al. | ............ 355/53 |
| 5,654,553 | A | * | 8/1997 | Kawakubo et al. | .......... 250/548 |
| 6,414,325 | B1 | * | 7/2002 | Yamada et al. | ........... 250/491.1 |

FOREIGN PATENT DOCUMENTS

| JP | 10-189496 | 7/1998 |
| JP | 11-47970 | 2/1999 |
| JP | 11-91116 | 4/1999 |
| JP | 2001-276986 | 10/2001 |
| JP | 2002-224878 | 8/2002 |
| JP | 2003-249427 | 9/2003 |
| JP | 2004-188422 | 7/2004 |

* cited by examiner

*Primary Examiner*—Tarifur Chowdhury
*Assistant Examiner*—Michael Lapage
(74) *Attorney, Agent, or Firm*—Oblon, Spivak, McClelland, Maier & Neustadt, L.L.P.

(57) ABSTRACT

Before applying a processing laser beam to a surface of a substrate through a film of liquid, distance M2 between a reference point on an axis of a first laser displacement meter and the surface of the substrate is measured to correct distance M1 between a lower end of an optical unit and the surface of the substrate, on the basis of distance M2, the processing laser beam is applied to the surface of the substrate, thereby cutting and removing a part of the surface of the substrate, and a depth to which the surface of the substrate has been cut and removed with the processing laser beam is measured by a second laser displacement meter.

15 Claims, 12 Drawing Sheets

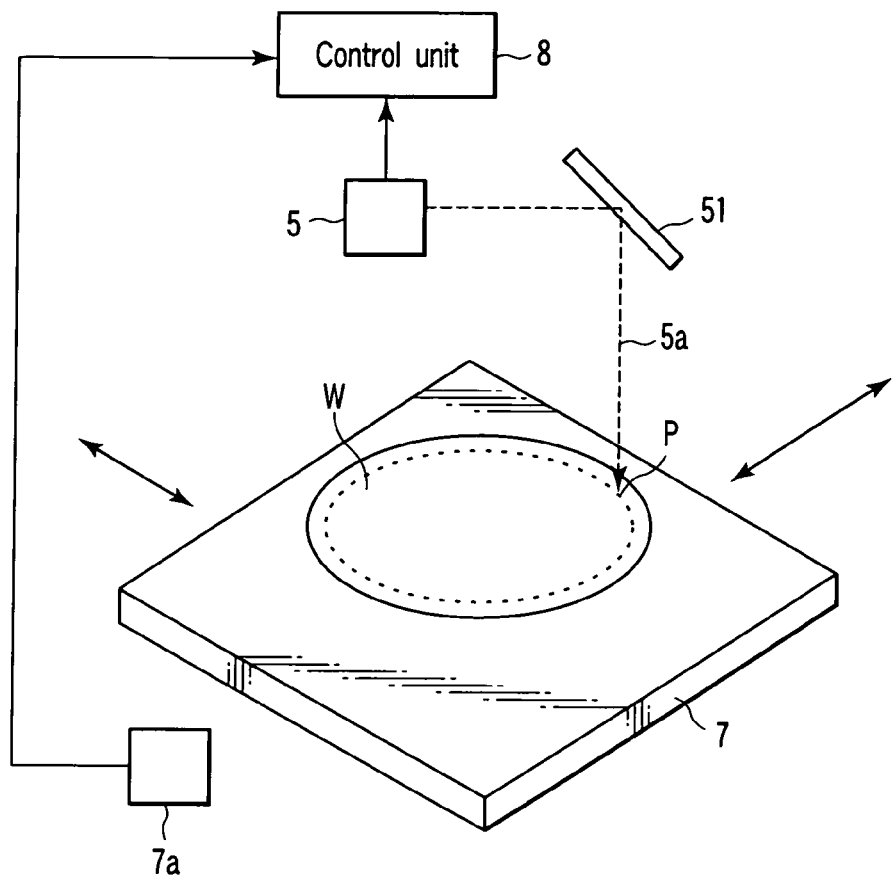
F I G. 8 A
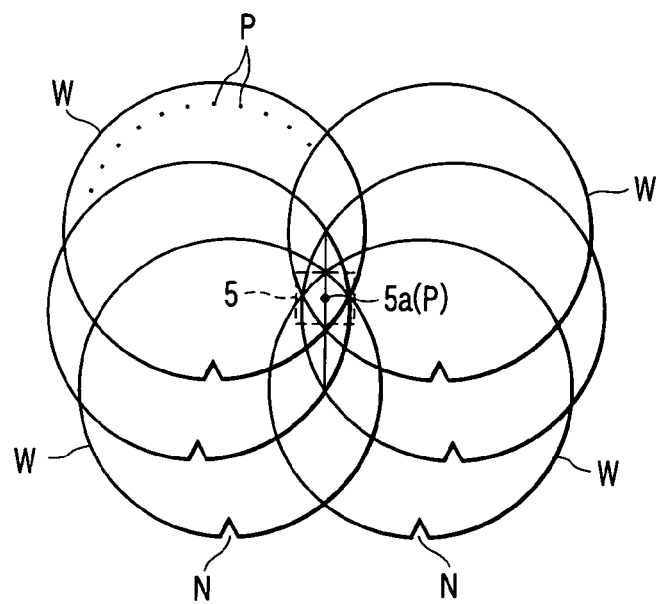
F I G. 8 B

| Measuring point | Position data | Distance M1 |
|---|---|---|
| P1A | ( ○ , ○ ) | ○  ○ |
| P1B | ( □ , □ ) | □  □ |
| ⋮ | ⋮ | ⋮ |
| PnA | ( △ , △ ) | △  △ |
| PnB | ( ◇ , ◇ ) | ◇  ◇ |

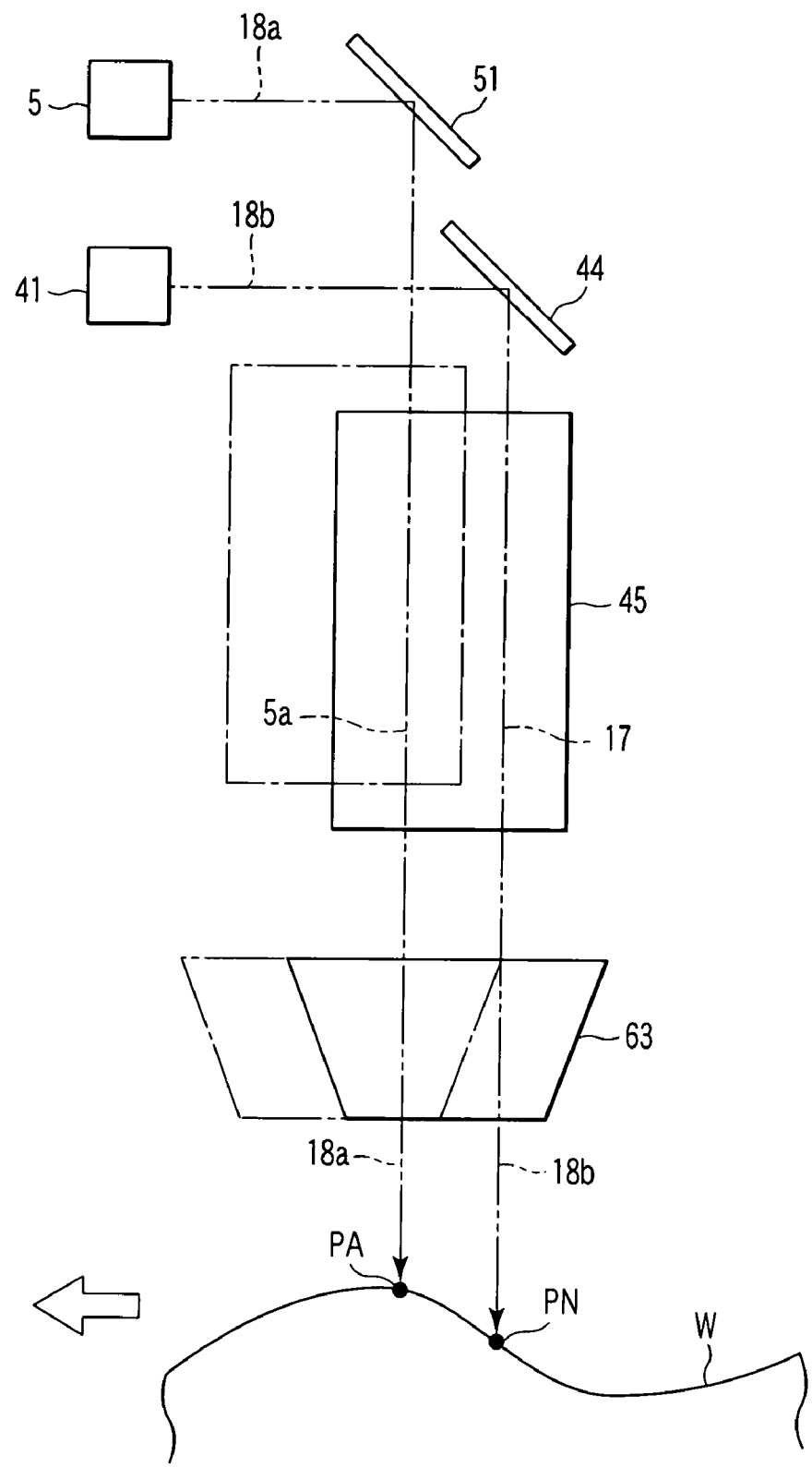
F I G. 14

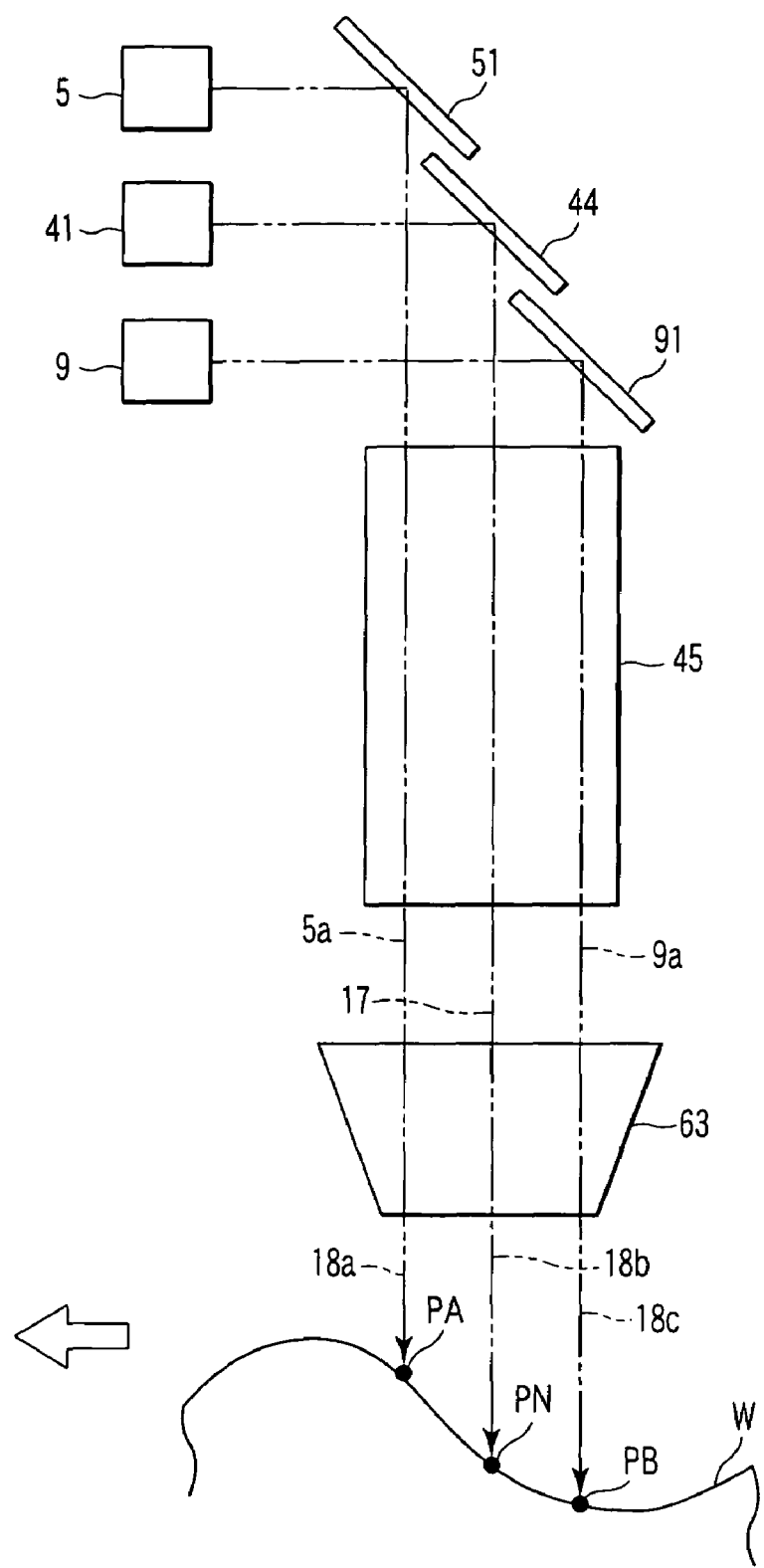
F I G. 15

LASER PROCESSING APPARATUS AND LASER PROCESSING METHOD FOR CUTTING AND REMOVING A PART OF A SURFACE REGION OF A SUBSTRATE

CROSS-REFERENCE TO RELATED APPLICATIONS

This application is based upon and claims the benefit of priority from prior Japanese Patent Application No. 2004-316559, filed Oct. 29, 2004, the entire contents of which are incorporated herein by reference.

BACKGROUND OF THE INVENTION

1. Field of the Invention

The present invention relates to a laser processing apparatus and a laser processing method, in which liquid is applied to a surface of a substrate such as a semiconductor wafer or a glass substrate for use in liquid crystal displays, the substrate covered with liquid is scanned with a laser beam, and the surface of the substrate is thereby processed.

2. Description of the Related Art

Methods of manufacturing semiconductor devices include steps of processing the surface of a substrate, by using a laser beam. Among these steps are: a step of processing a thin film such as an insulating film, a metal film or a resist film; a step of cutting dicing lines; a step of removing resist films from alignment marks before exposing the substrate to light (i.e., step of exposing the alignment marks). Jpn. Pat. Appln. KOKAI Publication No. 2002-224878, for example, describes a laser dicing process in which the surface of a substrate is scanned with a laser beam, thereby cutting dicing lines in the surface. Jpn. Pat. Appln. KOKAI Publication No. 2003-249427 discloses a process in which a laser beam is applied to a substrate before exposing the substrate to light, in order to remove a resist film covering alignment marks formed on the substrate, thereby to expose alignment marks. Laser beams are preferable for use in these processes, because they have a high energy density, making it possible to accomplish high-precision alignment.

Jpn. Pat. Appln. KOKAI Publication No. 2002-224878, mentioned above, discloses a laser processing apparatus. As FIG. 1 shows, the apparatus has a cup 11, a drive mechanism 12, and a chuck 13. The chuck 13 is provided in the cup 11. The drive mechanism 12 can rotates the chuck 13 and move the chuck 13 in the X- and Y-directions, positioning the chuck 13. The chuck 13 may hold a substrate 10, which has alignment marks and resist films covering the marks. A laser unit 14 applies a laser beam 18 to the resist films, removing the resist films from the substrate 10. A transparent plate 15 made of quartz glass is spaced a little from the substrate 10, facing the substrate 10. Pure water is kept flowing through gap between the substrate 10 and the transparent plate 15, supplied through an inlet port and drained from the gap trough an outlet port. This prevents dust formed in the laser dicing process from sticking to the surface of the substrate.

In most laser processes, a laser having a focal distance of about 50 μm is employed. If the work is placed at a distance shorter or longer than this focal distance, the laser dicing process cannot cut the resist films formed on the work. To cut dicing lines having a uniform depth, the laser needs to apply uniform energy to the work. Hence, the laser beam 18 should be focused at the surface of the substrate 10 in order to cut a dicing line in the surface of the substrate 10.

To focus the laser beam 18 at any point in the surface of the substrate 10, the substrate 10 must be located at a specific distance from the laser unit 14. To focus the laser beam 18 at any point in the surface of the substrate 10, and focus distances are uniformly adjusted to over the entire surface of the substrate, the surface flatness of the chuck 13 or that of the chuck-moving mechanism for moving the substrate 10 in the X- and Y-directions may be enhanced. If the chuck 13 and mechanism are machined at high precision to enhance their surface flatness, the manufacturing cost and the weight of the laser processing apparatus will inevitably increase.

Even if the chuck 13 and chuck-moving mechanism are improved in surface flatness, the apparatus is still disadvantageous because the chuck-moving mechanism has, for example, a ball screw that moves the chuck 13. When the ball screw is rotated, moving the chuck 13, its inclination angle varies, unavoidably inclining the surface of the chuck-moving mechanism. Further, even if the chuck 13 and chuck-moving mechanism are improved in surface flatness, the laser beam 18 cannot be focused at any point in the surface of the substrate 10, because the substrate 10 warps and has projections and depressions in its surface.

BRIEF SUMMARY OF THE INVENTION

An object of the present invention is to provide a laser processing apparatus and a laser processing method, in which a laser beam can be focused at any point in the surface of the substrate to be processed.

A laser processing apparatus according to this invention is of the type in which liquid is supplied to a surface of a substrate held in horizontal position by a substrate-holding unit, forming a film of liquid on the surface, and a processing laser beam is applied to the surface through the film of liquid, thereby processing the surface of the substrate. The apparatus comprises: a light-applying section which has a laser unit that emits the processing laser beam and a focusing unit that focuses the processing laser beam on the surface of the substrate held by the substrate-holding unit; a drive mechanism which moves the substrate-holding unit and the light-applying section relative to each other in a horizontal direction, thereby to move the substrate to align an axis of the processing laser beam with a point in the surface of the substrate; a lift mechanism which moves the focusing unit up from or, down toward, the surface of the substrate held by the held by the substrate-holding unit; height-map acquiring means for measuring distances between the focusing unit and a plurality of points on the surface of the substrate held by the substrate-holding unit and for acquiring, from the distances measured, a height map of the surface of the substrate; and control unit which controls the drive mechanism to scan, with the processing laser beam, the surface of the substrate held by the substrate-holding unit and controls the lift mechanism in accordance with the height map to adjust the distance between the surface of the substrate an the focusing unit.

The height-map acquiring means has a first laser displacement meter that applies a first distance-measuring laser beam to the surface of the substrate, thereby to measure a height of the surface of the substrate.

The control unit sets a plurality of measuring points on the surface of the substrate, causes the drive mechanism to move the substrate, thereby to align each measuring point with an axis of the first distance-measuring laser beam, causes the first laser displacement meter to apply the first distance-measuring laser beam to each measuring point and to measure the height of surface of the substrate at each measuring point, and causes the lift mechanism to move the focusing section, thereby to correct the distance between the focusing unit and the surface of the substrate.

The measuring points exist on a scanning line scanned with the processing laser beam. These points may include two points which are at a peripheral surface of the substrate. In this case, the height-map acquiring means obtains a straight line from the heights of surface of the substrate, which have been measured at the two measuring points. The height-map acquiring means generates a height map of the substrate surface from the straight line. This straight line is approximate to an inclination of the substrate surface.

The substrate is shaped like a disc, the measuring points exist at a circumferential edge of the surface of the substrate. The drive mechanism moves the substrate-holding unit in X-direction and Y-direction in a two-dimensional plane. The map-acquiring means has a first laser displacement meter which applies a first distance-measuring laser beam to the surface of the substrate, thereby to measure the height of surface of the substrate. The control unit controls the drive mechanism, thereby to align the measuring points, one after another, with an axis of the first distance-measuring laser beam.

The map-acquiring means may have a first laser displacement meter that applies a first distance-measuring laser beam to the surface of the substrate. In this case, first distance-measuring laser beam may be coaxial with the processing laser beam or may have an axis in front of an axis of the processing laser beam (see FIG. 14).

The processing laser beam may cut and remove a part of the surface region of the substrate. In this case, a second laser displacement meter may be used, which applies a second distance-measuring laser beam at the back of the processing beam, detects the second distance-measuring beam reflected from the surface of the substrate and determines a depth to which the surface region of the substrate has been processed with the processing laser beam (see FIG. 15).

The control means can control the lift mechanism in accordance with the height map of the substrate surface, thereby to correct the height of the focusing unit, before the light-applying section applies the processing laser beam to one measuring point.

The control unit may set a threshold value for the depth and may generate an alarm when the surface region is processed to a depth greater than the threshold value.

A laser processing method according to this invention is of the type, in which liquid is supplied to a surface of a substrate held by a substrate-holding unit, forming a film of liquid on the surface, a laser beam emitted from a laser unit is focused by a focusing unit on the surface of the substrate, and a processing laser beam is applied through the film of liquid to the surface of the substrate, thereby processing the surface of the substrate. The process comprises:

(a) acquiring a height map of the surface of the substrate by setting a plurality of measuring points on the surface of the substrate held by the substrate-holding unit, by moving the substrate by a drive mechanism to align each measuring point with an axis of a first distance-measuring laser beam, by applying the first distance-measuring beam to each measuring point by a first laser displacement meter, and by measuring height of surface of the substrate at the measuring points;

(b) correcting a distance between the focusing unit and the surface of the substrate, by moving the focusing unit up or down by a lift mechanism in accordance with the height map acquired; and (c) processing the surface of the substrate by positioning the focusing unit at the distance corrected and by applying the processing laser beam to the measuring points.

The measuring points set in the step (a) exist on a scanning line scanned with the processing laser beam and includes two points which are at a circumferential edge of the surface of the substrate.

In the step (a), a straight line is obtained from the heights of surface of the substrate, which have been measured at the two measuring points, and a height map of the substrate surface is generated from the straight line, the straight line being approximate to an inclination of the substrate surface.

If the measuring points exist at a circumferential edge of the substrate, the drive mechanism can be controlled, thereby to align the measuring points, one after another, with an axis of the first distance-measuring laser beam.

The step (c) may be to cut and remove a part of the surface region of the substrate. In this case, a second distance-measuring laser beam is applied to the substrate at the back of the processing beam, and the second distance-measuring laser beam reflected from the surface of the substrate is detected, thereby to determine the depth to which the surface region of the substrate has been processed with the processing laser beam.

In the step (c), a threshold value may be set for the depth, and an alarm may be generated when the surface region is processed to a depth greater than the threshold value.

A laser processing method according to this invention is designed for use in a laser processing apparatus that comprises a substrate-holding unit, a light-applying section having a laser unit for emitting a processing laser beam and a focusing unit for focusing the processing laser beam on a surface of a substrate held by the substrate-holding unit, and a laser displacement meter for applying another laser beam to the surface of the substrate to measure the height of surface of the substrate, and in which the processing laser beam and the other beam are simultaneously applied to the surface of the substrate, thereby to process the surface of the substrate. The process comprises:

(i) setting a plurality of measuring points on the surface of the substrate, moving the substrate by a drive mechanism, thereby to align each measuring point with an axis of the first distance-measuring laser beam, causing the laser displacement meter to apply a first distance-measuring laser beam to each measuring point and to measure the height of surface of the substrate at each measuring point;

(ii) correcting the height of the focusing unit in accordance with the height map of the substrate surface before the light-applying section applies the processing laser beam to the measuring point; and (iii) processing the surface of the substrate by positioning the focusing unit at the distance corrected and by applying the processing laser beam to the measuring points.

The step (iii) is to cut and remove a part of the surface region of the substrate by applying the processing laser beam to the surface of the substrate, and in the step (i), a second distance-measuring laser beam is applied to the at the back of the processing beam, the second distance-measuring laser beam reflected from the surface of the substrate is detected, and a depth to which the surface region of the substrate has been processed with the processing laser beam is determined.

BRIEF DESCRIPTION OF THE SEVERAL VIEWS OF THE DRAWING

FIG. 8A is partly a perspective view and partly a block diagram, explaining a method of measuring the surface displacement of a substrate;

FIG. 8B is a plan view showing how a wafer is moved to various positions (measuring points) with respect to the axis of a laser beam;

FIG. 14 is partly a sectional view and partly a block diagram, showing an optical unit and illustrating a laser process according to another embodiment; and FIG. 15 is partly a sectional view and partly a block diagram, showing the optical unit and illustrating a laser process according to still another embodiment.

DETAILED DESCRIPTION OF THE INVENTION

Preferred embodiments of the present invention will be described, with reference to the accompanying drawings.

First Embodiment

Figure 2:
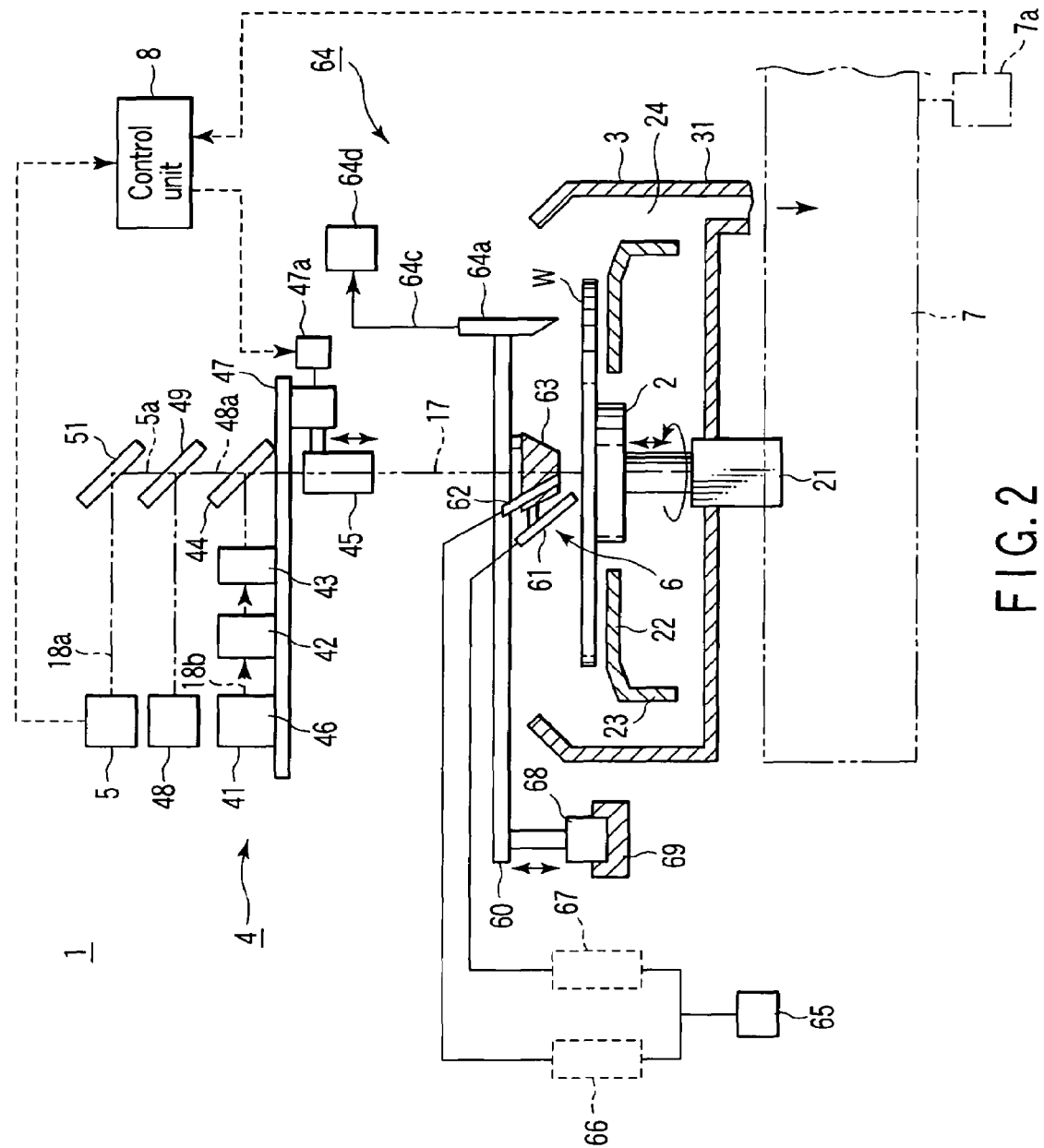
FIG. 2 is a partly sectional, block diagram illustrating a laser processing apparatus according to an embodiment of this invention.

FIG. 2 is a diagram illustrating a laser processing apparatus according to an embodiment of this invention. The laser processing apparatus 1 is used in various processes such as dicing and processing of thin films. More specifically, the apparatus 1 can process various thin films such as insulating film, metal film and resist film, can form dicing lines and can remove a resist film from alignment marks to expose the marks to light. The apparatus 1 has a spin chuck 2, a cup 3 and a drive unit 21. The spin chuck 2 is a substrate-holding unit for holding a wafer W by suction, keeping the wafer W in a horizontal position. The chuck 2 is arranged in the cup 3, which is shaped like a hollow cylinder. The drive unit 21 rotates the spin chuck 2 around a vertical axis (Z-axis) and moves the spin chuck 2 up and down along the Z-axis.

The cup 3 has an outlet port (liquid-discharging port) 31 made in the bottom and located near the circumference of the bottom. Through the outlet port 31, the liquid (e.g., water) dripping from the wafer W can be discharged from the laser processing apparatus 1.

The apparatus 1 has a horizontal plate 22. The plate 22 lies right below the wafer W held by the chuck 2 and surrounds the chuck 2. The circumferential edge of the plate 22 is bent downwards, forming a hollow cylinder 23. The follow cylinder 23 and the cup 3 define a passage 24. Pure water can flow through the passage 24 before it is discharged through the liquid-discharging port 31.

The laser processing apparatus 1 comprises a laser unit 4 and a liquid-film forming unit 6. The laser unit 4 is used to perform a specific process (e.g., dicing or removal of resist films or insulating films). The liquid-film forming unit 6 is designed to form a liquid film on the wafer W. The laser unit 4 is secured to an outer case (not shown). The laser unit 4 comprises a laser source 41, a homogenizer 42, a mask 43, a half-mirror 44, a beam-focusing optical unit (hereinafter called "optical unit") 45.

The laser oscillator (laser source) 41 is, for example, a YAG laser or an excimer laser. It emits a processing laser beam 18b that has a circular cross section. The homogenizer 42 changes the laser beam 18b to one that has a rectangular cross section. The mask 43 receives the laser beam 18b from the homogenizer 42 and changes the cross section of the beam to a prescribed cross section. The half-mirror 44 reflects the laser beam 18b coming from the mask 43, guiding the laser beam 18b to the surface of the wafer W. The optical unit (i.e., beam-focusing unit) 45 is provided at downstream of the half-mirror 44. A lens barrel focuses the laser beam 18b on the surface of the wafer W.

The laser source 41, homogenizer 42, mask 43 and half-mirror 44 are mounted on a base 46 that is fixed to the outer case (not shown). The optical unit 45 is held by a lift mechanism 47, which in turn is mounted on the base 46. The lift mechanism 47 moves the optical unit 45 up and down, as it is controlled by a controller 47a. The controller 47a is controlled by a control unit 8, which will be described later.

The laser processing apparatus 1 comprises a CCD camera 48 and a laser displacement meter 5. The CCD camera 48 and the laser displacement meter 5 are positioned on, and secured to, the outer case of the laser processing apparatus 1, with their optical axes extending to the surface of the wafer W.

The CCD camera 48 has an optical axis 48a, which extends from a first half-mirror 49 to the surface of the wafer W. The laser displacement meter 5 has an optical axis 5a, which extends from a second half-mirror 51 to the surface of the wafer W. The laser beam 18b has an axis 17, which extends from the half-mirror 44 to the surface of the wafer W. The optical axis 48a of the camera 48 and the optical axis 5a of the laser displacement meter 5 align with the axis 17 of the laser beam 18b.

Figure 3:
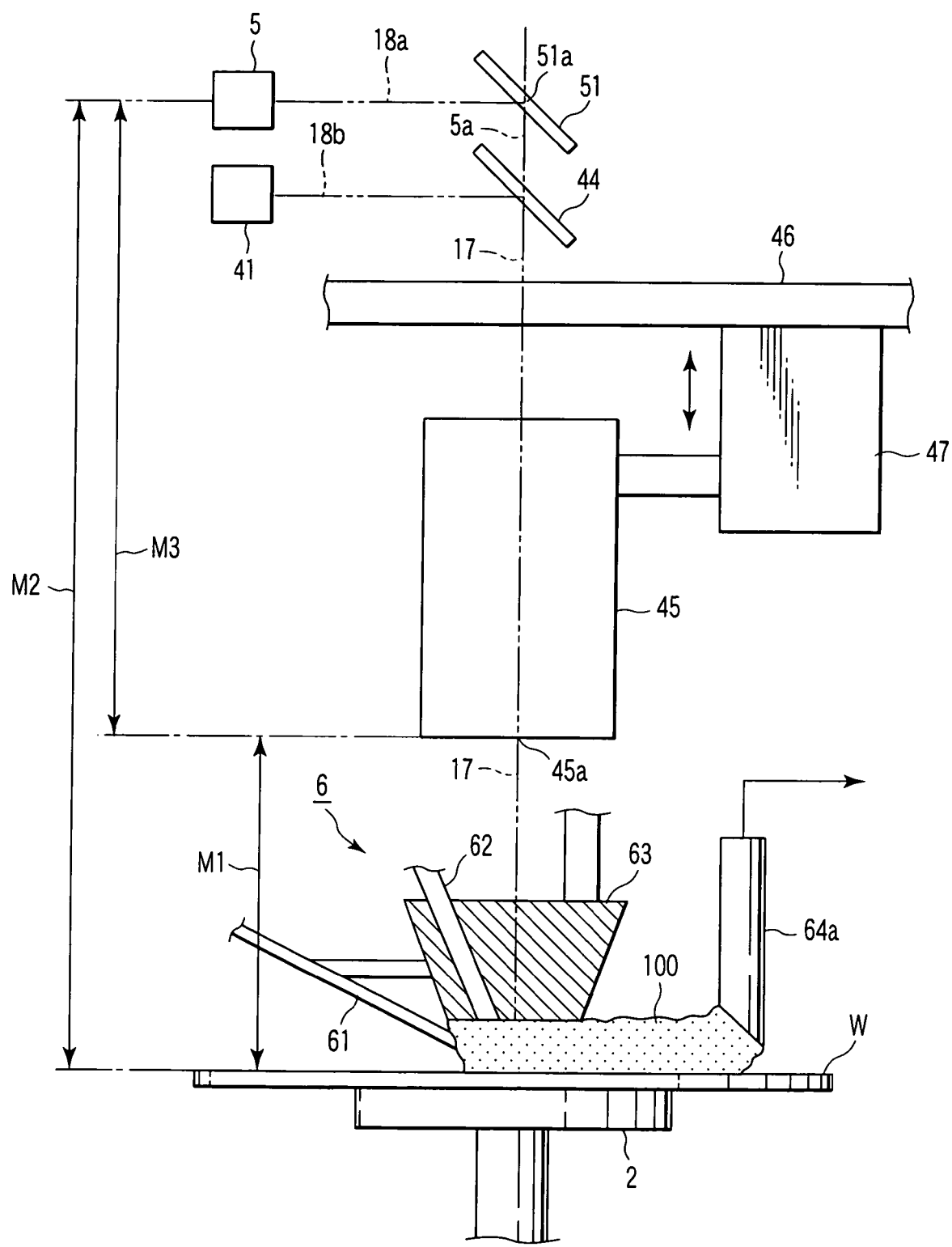
FIG. 3 is a block diagram depicting the optical system unit and liquid-film forming unit of the laser processing apparatus according to this invention.

The laser displacement meter 5 is a distance-measuring device that measures the height of the wafer surface at high precision, by applying a specific laser beam 18a to the surface of the wafer W and detecting the light reflected from the wafer W. In this embodiment, the "height of the surface of the wafer W" measured is distance M1 between the lower end of the optical unit 45 and the surface of the wafer W, as illustrated in FIG. 3. The laser displacement meter 5 generates data representing the distance M1 it has measured. This data is output to the control unit 8. In the control unit 8, the data is stored in a data storage unit 83. The laser displacement meter 5 is, for example, an LC type, manufactured by Keyence (i.e., a laser displacement sensor of LC Series, Keyence Co., Ltd.).

The laser beam 18b emitted from the laser source 41 has a wavelength ranging from about 233 nm to about 532 nm. The laser beam 18a emitted from the laser emitted from the laser displacement meter 5 has a wavelength of about 670 nm. Hence, no problems will arise in the laser process if the optical axis 48a of the CCD camera 48, the optical axis 5a of the laser displacement meter 5 and the optical axis 17 of the laser beam 18b align with one another.

The liquid-film forming unit 6 comprises liquid-supplying nozzles 61 and 62, a liquid-guiding member 63, and a liquid-recovering section 64. The liquid-supplying nozzles 61 and 62 supply liquid (e.g., pure water) to the wafer W. The liquid-guiding member 63 guides the pure water flowing on the wafer W, thus forming a film of liquid. The liquid-recovering section 64 recovers the liquid that has passed that part of the surface of the water W, which is illuminated with the laser beam 18b. The liquid-guiding member 63 is made of transparent material such as quartz glass and is shaped like an inverted cone.

The nozzle 61 is fixed outside the liquid-guiding member 63. Two nozzles 62, only one of which is shown in FIG. 3, are provided in the liquid-guiding member 63. The nozzles 62 are arranged with their outlet ports located on the sides of the outlet port of the nozzle 61, respectively. The liquid is applied from the center nozzle 61 at speed of, for example, 20 m/min, and from the lateral nozzles 62 at a speed that is considerably lower than said speed. Thus, anything that should be removed (anything exfoliated) can be washed away with the liquid flowing fast from the surface of the wafer W, without being dispersed, during the laser process such as dicing or removal of resist film or insulating film. In FIG. 2, reference numeral 65 denotes a source of pure water. Reference numerals 66 and 67 denote supply control systems, each incorporating a valve, a flow-rate adjusting unit, a pump and the like.

Figure 1:
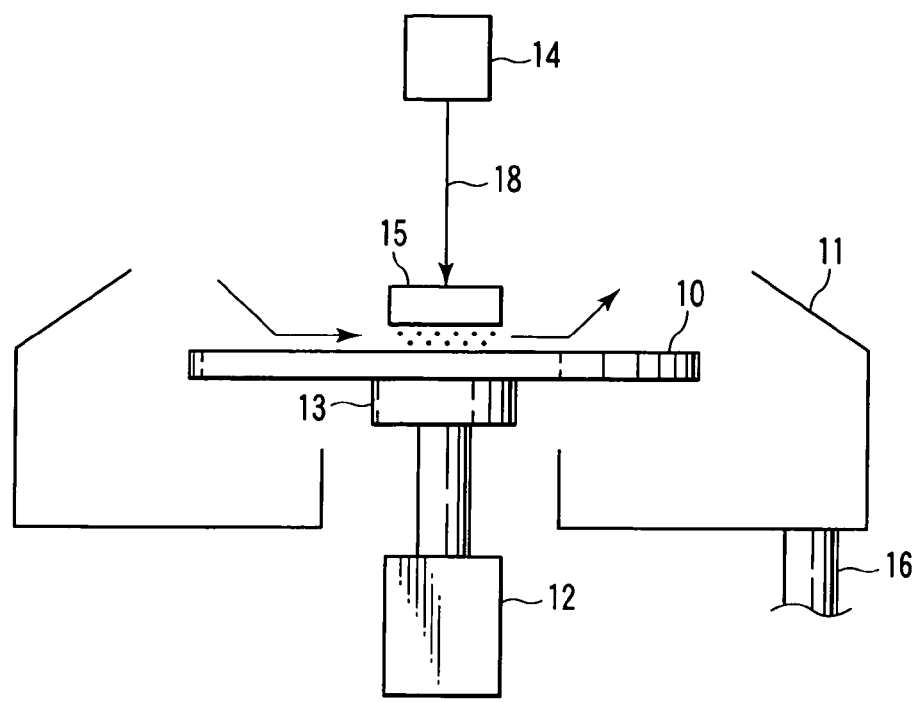
FIG. 1 is a schematic diagram showing a conventional laser processing apparatus.
Figure 4:
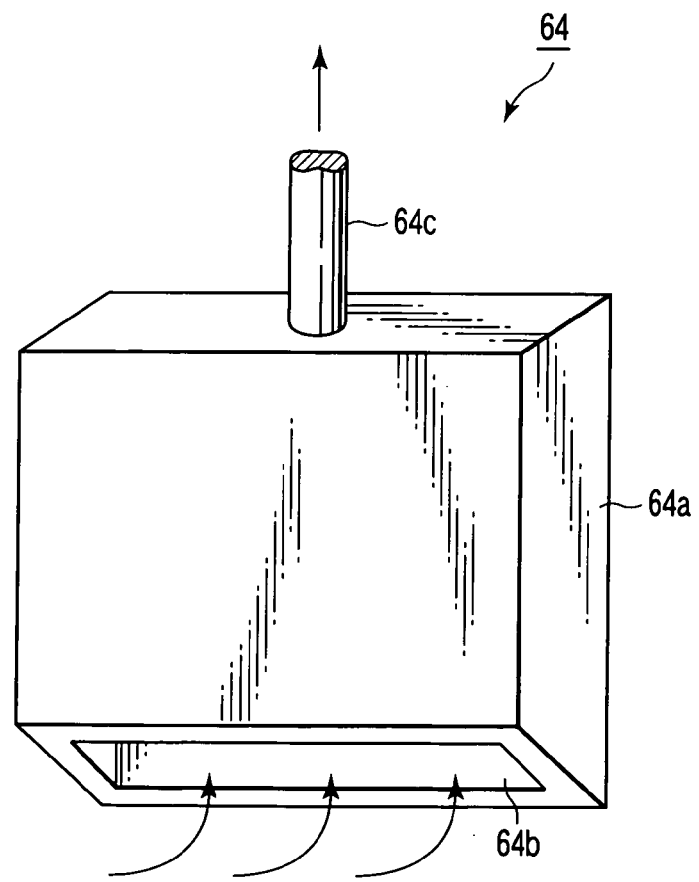
FIG. 4 is a perspective view of the recovery nozzle for recovering liquid.

The liquid-recovering section 64 is shaped like a rectangular block as shown in FIG. 4. The section 64 has a recovering nozzle 64a, a recovering passage 64c and a suction means 64d. The recovering nozzle 64a has a suction port 64b at the distal end so that the liquid may be recovered while flowing, in the form of a band, on the surface of the water W. As seen form FIG. 2, the suction means 64d is an ejector that applies a suction force on the recovering nozzle 54a through the recovering passage 64c.

The liquid-guiding member 63 and the recovering nozzle 64a are secured a support arm 60. A lift mechanism 68 is provided at the proximal end of the support arm 60. As FIG. 2 shows, the lift mechanism 68 can move along a rail 69 that extends in the direction perpendicular to the drawing. Hence, the support arm 60 can move not only up and down, but also in one direction in a horizontal plane. The configuration of the liquid-film forming unit 6 is not limited to the one described above. It may have one of various configurations disclosed in, for example, Jpn. Pat. Appln. KOKAI Publication No. 2003-249427.

Figure 5:
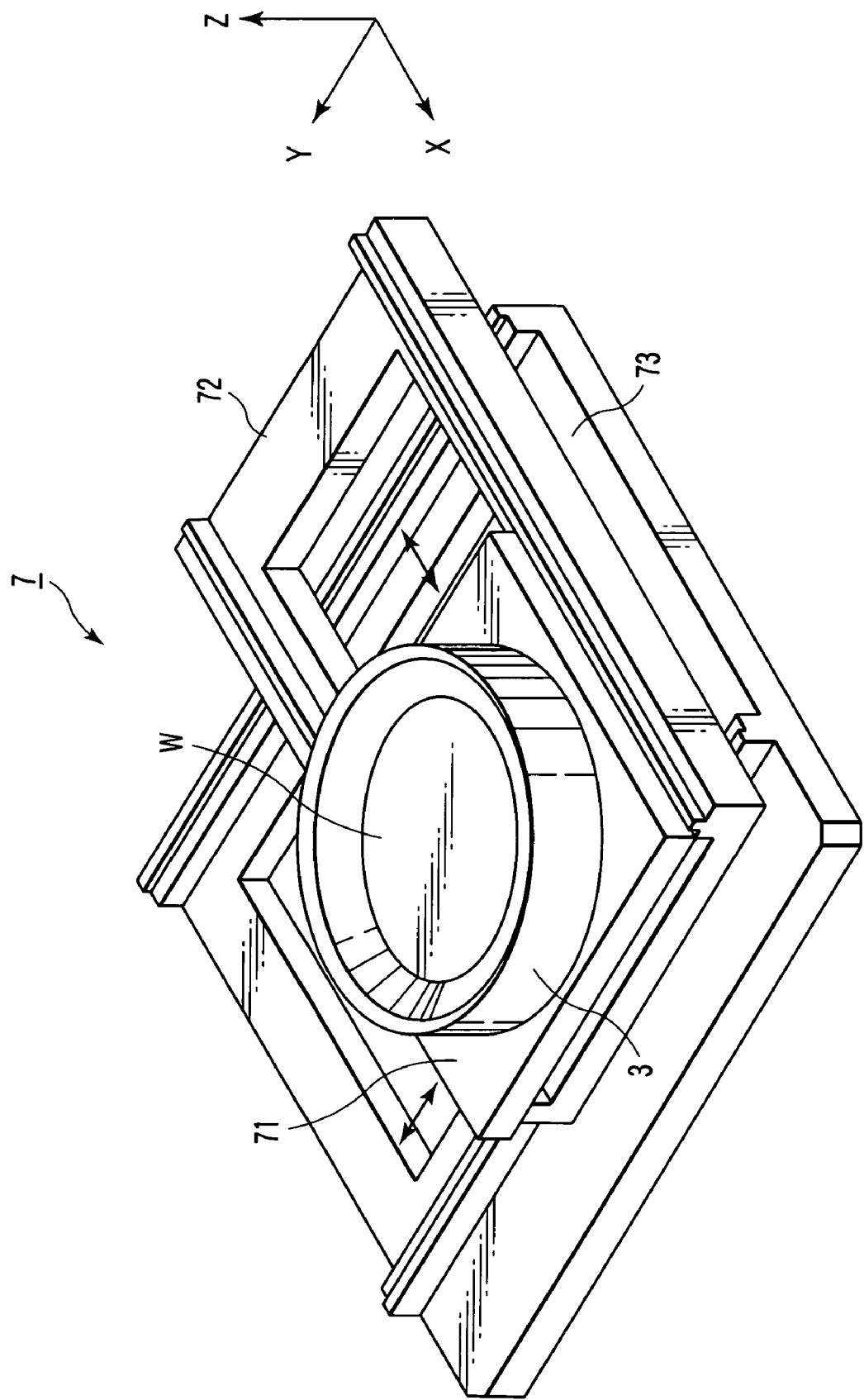
FIG. 5 is a perspective view illustrating a cup and a drive mechanism.

As FIG. 2 shows, the laser processing apparatus 1 has an X-Y stage 7 as indicated by a two-dot, dashed line. The X-Y stage 7 is a drive mechanism that moves the cup 3 in a horizontal plane. As FIG. 5 shows, the X-Y stage 7 comprises a first stage 71, a second stage 72, and a base 73. The first stage 71 holds the cup 3. The second stage 72 has a drive mechanism that can drive the first state 71 in the X direction. The second state 72 can move on the base 73 that is secured to the above-mentioned housing (not shown). That is, the first stage 71 can move in the X direction, and the second stage 72 can move in the Y direction. The base 73 has a drive mechanism that can drive the second stage 72 in the Y direction. These drive mechanisms comprise a guide rail, a ball-screw mechanism and an electric motor. They are controlled by a controller 7a, which in turn is controlled by a control unit 8 (see FIG. 2).

The control unit 8 of the laser processing apparatus 1 has a data storage unit 83 that stores programs. The control unit 8 uses the programs to control the lift mechanism 47 of the optical unit 45, the flow-rate control units 66 and 67, the drive unit 21, and the X-Y stage 7.

Figure 6:
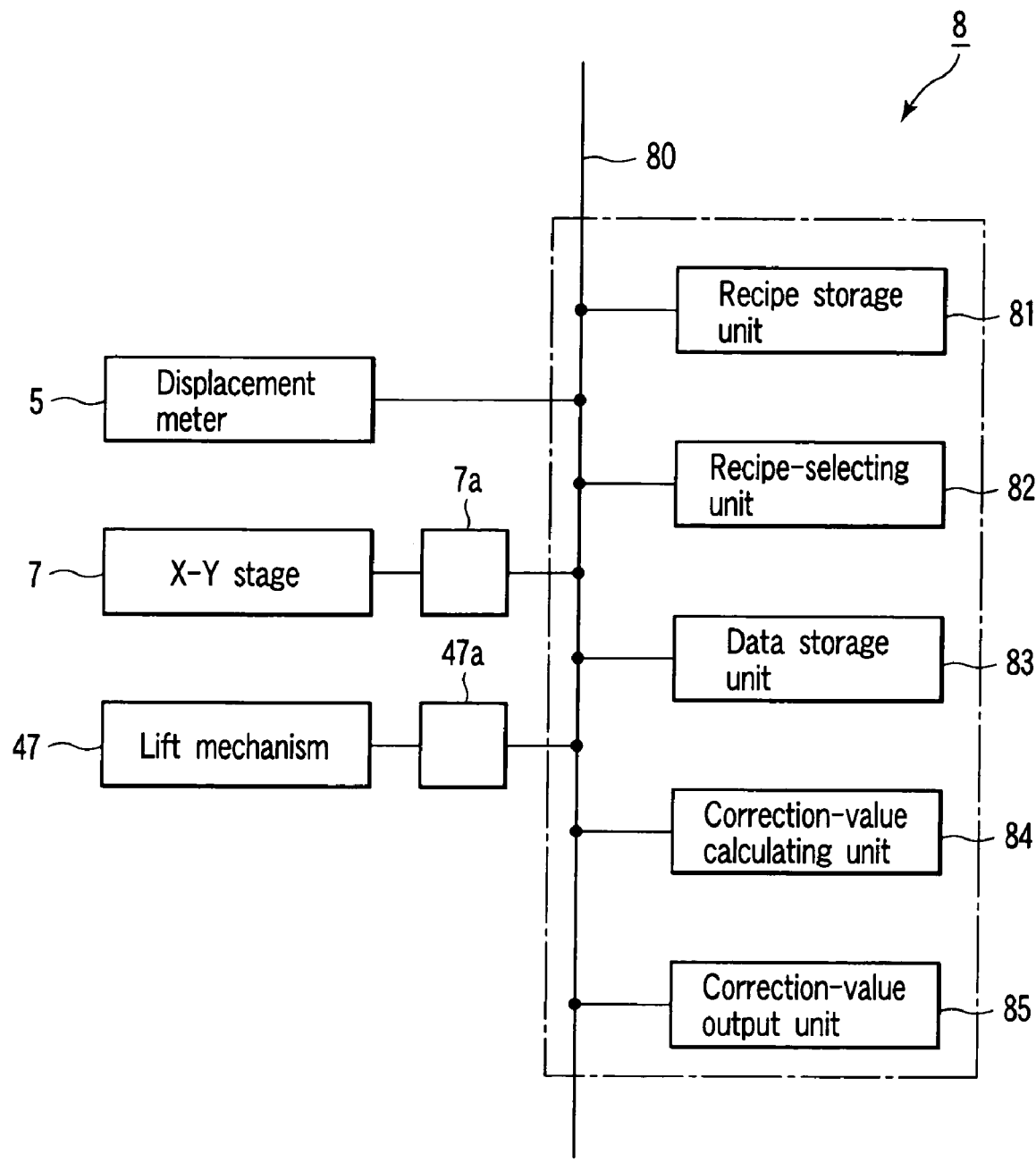
FIG. 6 is a perspective view showing the major components of the control unit of the apparatus according to this invention.

The control unit 8 will be described, with reference to FIG. 6.

The control unit 8 has peripheral components such a CPU, a program storage unit and a memory. Here, only the components that control the lift mechanism 47 of the optical unit 45 in accordance with the height measured of the surface of the wafer W.

The control unit 8 comprises a system bus 80, a recipe storage unit 81, a recipe-selecting unit 82, a data storage unit 83, a correction-value calculating unit 84, and a correction-value output unit 85. The units 81, 82, 83, 84 and 85 are connected to the system bus 80. Also connected to the system bus 80 are the laser displacement meter 5, the controller 7a of the X-Y stage 7, and the controller 47a of the lift mechanism 47. The recipe storage unit 81 stores many recipes, each describing the conditions of processing the wafer W. The recipe-selecting unit 82 selects one of the recipes stored in the recipe storage unit 81.

The data storage unit 83 stores data that represents the height that the laser displacement meter 5 has measured of the surface of the wafer W. The correction-value calculating unit 84 generates a height map from the surface height and position that have been measured of the wafer W, and calculates a correction value by which the position of the optical unit 45 should be corrected with respect to the surface of the wafer W.

The correction-value output unit 85 correlates the correction value calculated by the calculating unit 84, with the time axis, and timely outputs the correction value to the controller 47a of the lift mechanism 47. In the present embodiment, the laser displacement meter 5 and a part of the control unit 8 constitute means for acquiring the height map.

Figure 7:
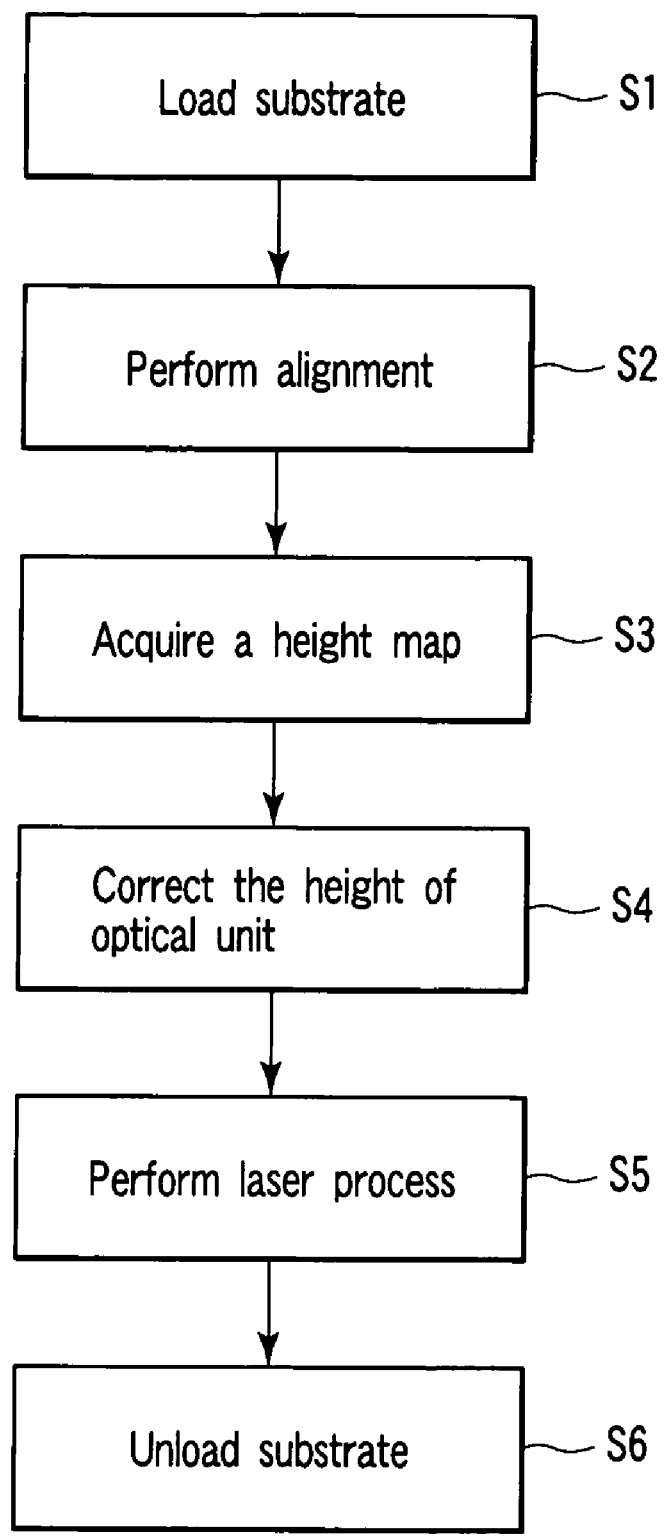
FIG. 7 is a chart representing the steps of a laser processing method according to an embodiment of this invention.

A laser process method that the laser processing apparatus 1 performs will be explained, with reference to FIG. 7. A transfer arm (not shown) transfers a wafer W having an integrated circuit formed in it, into the laser processing apparatus 1. In the apparatus 1, the wafer W is transferred to the chuck 2 provided in the cup 3 located at a wafer-transfer position (Step S1). That is, the chuck 2 is first raised, then receives the wafer W, and is lowered. The CCD camera 48 detects the orientation flat or notch N of the wafer W, generating a position signal representing the position of the orientation flat or notch. The wafer W is positioned on the basis of the position signal (Step S1). Then, the laser displacement meter 5 acquires a height map of the wafer surface (Step S3).

The sequence of generating a height map will be described, with reference to FIGS. 8A and 8B and FIGS. 9 to 11. A plurality of measuring points P exist on the wafer W, in a circle that is spaced at a prescribed distance from the circumference of the wafer W. In the circle, the points P are arranged at a predetermined pitch. As shown in FIG. 8B, the wafer W has a notch N cut in the circumferential edge. The X-Y stage 7 is driven, revolving the wafer W around the optical axis $5a$ of the laser displacement meter 5, while holding the wafer W in the same orientation. Thus, the measuring points P are aligned with the axis $5a$, one after another. The positioning of the wafer W and the measuring thereof are alternately and repeatedly carried out. Since the control unit 8 can control the X-Y stage 7 with high precision, each measuring point P can be accurately aligned with the optical axis $5a$.

The "height of surface of the wafer W" is determined by measuring the distance M1 between the surface (upper surface) of the wafer W and the lower surface of the optical unit 45 and by detecting, at each measuring point P, the height of the wafer surface from a reference position. In practice, what the laser displacement meter 5 measures is distance M2 shown in FIG. 3. Distance M2 is a distance between the base point 51a on the optical axis $5a$ of the laser displacement meter 5 (i.e., a point where the second half-mirror 51 reflects the beam). To measure the height of surface of the wafer W, the laser displacement meter 5 is held at such a specific height that distance M3 between the base point 51a on the optical axis 5a and the lower surface 45a of the optical unit 45 is constant. Hence, distance M1 can be determined by measuring distance M2. Distance M1 is a distance between the surface of the wafer W and the lower surface of the optical unit 45.

To generates a height map for use in, for example, dicing process, the laser displacement meter 5 measures the height of surface of the wafer W at two measuring points P1A and P1B that are on a scanning line (dicing line DL1) of laser beam 18b and arranged along the circumference of the wafer W. Measuring points P1A and P1B on dicing line DL1 (or points PA2 and P2B on dicing line DL2, . . . , or points PnA and PnB on dicing point DLn) can be located at a prescribed distance (e.g., about 2 mm) from the circumferential edge.

Figures 9, 10:
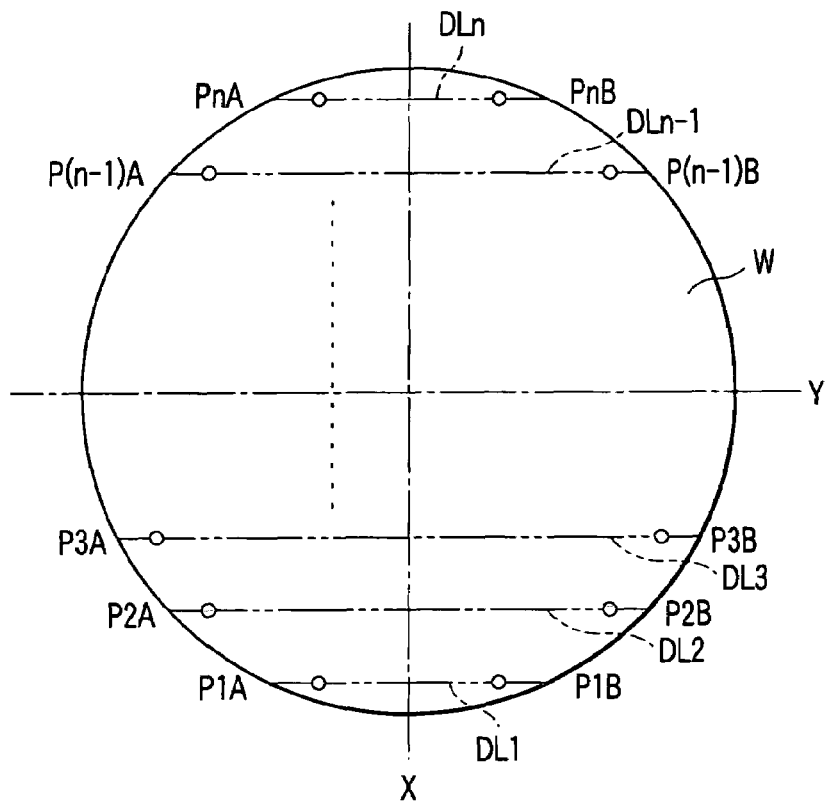
FIG. 9 is a plan view of a wafer, illustrating how the surface displacement of the wafer is measured at various points.
FIG. 10 is a table showing various measuring points, position data items and distances M1, which are represented by the data stored in a data storage unit.

Dicing lines DL1 to DLn are indicated by two-dot, dashed lines in FIG. 9. Distances M1 are measured at the ends of dicing lines DL1 to DLn beginning with points P1A and P2A, then points P2A and P3A, ..., and finally at points P2B and P1B. The measuring points (P1A, P2B, ... PnA and PnB) are position data items showing various positions that the X-Y stage 7 may take. The position data items are stored in the data storage unit 83, in association with the data items representing distances M1, i.e., the heights of wafer surfaces measured at points P1A, P1B, P2A, P2B, ... and PnA and PnB.

After distances M1 have been thus measured at all measuring points P1A, P1B, P2A, P2B, . . . PnA and PnB, the correction-value calculating unit 84 finds the inclination of the wafer surface, for example the inclination of dicing line DL1 from the data item representing the distance between points P1A and P1B. A height map is generated from the inclination calculated, or the inclination of wafer surface, along line D.

Figure 11:
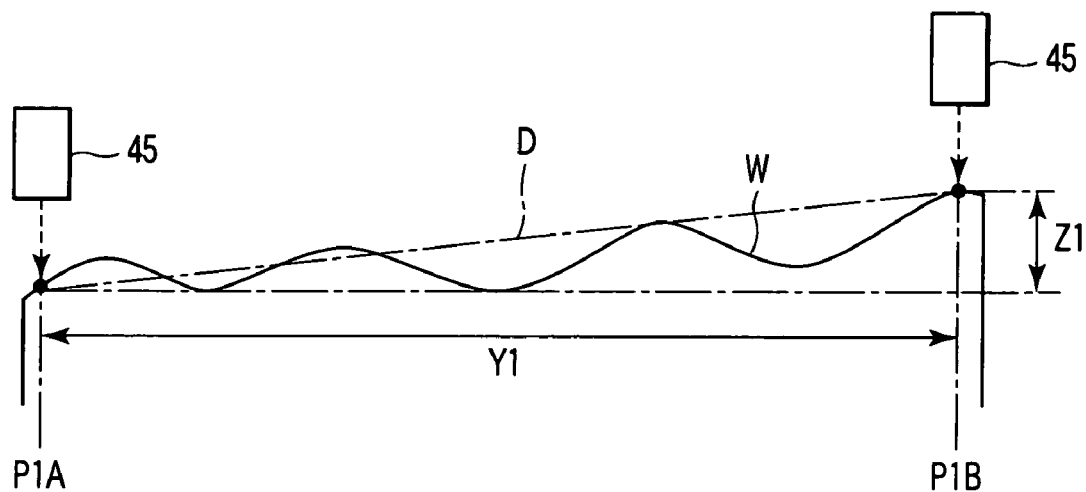
FIG. 11 is a side view explaining a method of correcting the height of an optical unit.

More specifically, as shown in FIG. 11, the heights at measuring points P1A and P1B from the reference position for wafer surface are determined from the data item representing distance M1 between the measuring points P1A and P1B that lie at the ends of dicing line DL. Then, a difference Z1 between the heights thus determined. Further, distance Y1 between measuring points P1A and P1B is obtained from the position data items about measuring points P1A and P1B. From difference Z1 and distance Y1, we obtain an equation of line D that approximates to the inclination of the wafer surface, along dicing line LD1 that extends between measuring points P1A and P1B. The equation of line D is the height map.

The correction-value calculating unit 84 then calculates a correction value by which to correct the height of the optical unit 45 from the surface of the wafer W (Step S4), so that the unit 45 may move from point P1A to point P1B along line D, i.e., the height map.

Namely, the unit 84 calculates a correction value by which the height of the optical unit 45 should be corrected to cut all dicing lines DL, each extending from one measuring point P to another point P. The correction-value output unit 85 outputs the correction value to the controller 47a of the lift mechanism 47. The correction-value output unit 85 correlates the correction value with the time axis. It therefore timely outputs the correction value to the controller 47a of the lift mechanism 47.

Next, the X-Y stage 7 moves the cup 3 until the dicing-starting point on the wafer W comes into alignment with the optical axis 17 of the laser unit 4. Subsequently, the support arm 60 moves the liquid-supplying nozzles 61 and 62, liquid-guiding member 63 and recovering nozzle 64a from the standby position to a predetermined position near the surface of the wafer W. The predetermined position is, for example, 2 mm above the wafer W. Then, the liquid-supplying nozzles 61 and 62 supply liquid, or pure water in this embodiment, to the surface of the wafer W. A water film (liquid film) 100 is thereby formed below the liquid-guiding member 63, as is illustrated in FIG. 3. At this time, the suction means 64d of the liquid-recovering section 64 is driven. The recovering nozzle 64a therefore recovers the liquid after guided by the liquid-guiding member 63.

While a film of pure water remains on the wafer W and the laser beam 18b emitted from the laser unit 4 and guided by the liquid-guiding member 63 is illuminating the surface of the wafer W, the X-Y stage 7 repeatedly moves the chuck 2, first in the X direction and then in the Y direction. Thus, the laser beam 18b scans the surface of the wafer W along lines extending in the X direction, and then along lines extending in the Y direction (Step S5). As a result, the surface of the wafer W is half-cut, forming dicing lines DL, some of which extend in the X direction and the others of which in the Y direction. The wafer W will be cut along dicing lines by the laser beam 18bDL, by applying a force from the lower surface of the wafer, and be divided into chips. The dust formed when the laser beam 18b half-cuts the surface of the wafer W are washed away with the pure water and collected from the wafer W through the recovering nozzle 64a. A greater part of the pure water supplied from the liquid-supplying nozzles 61 and 62 is recovered through the recovering nozzle 64a. The remaining part of the pure water drips into the cup 3, overflows the cup 3 and is discharged through the liquid-discharging port 31.

After dicing lines DL are cut in the surface of the wafer W, the liquid-supplying nozzles 61 and 62, liquid-guiding member 63 and recovering nozzle 64a are moved back to the standby position. Then, the chuck 2 is raised, and the wafer W is transferred from the chuck to the transfer arm (not shown). The transfer arm transfers the wafer W from the laser processing apparatus 1 (Step S6). Steps S1 to S6 are performed in accordance with the program stored in the control unit 8.

In the present embodiment, the laser displacement meter 5 measures, at measuring points P, distance M1 between the surface of the wafer W and the optical unit 45, thus determining the heights that the wafer surface have at measuring points P. A height map is thereby generated for the surface of the wafer W. The height of the optical unit 45 is corrected in accordance with the height map. Distance M1 therefore remains unchanged even if the wafer W has projections and depressions in its surface. Hence, the optical unit 45 can focuses the laser beam 18b, substantially at the surface of the wafer W. The beam 18b can be applied at uniform efficiency at every part of the wafer surface. This makes it possible to cut dicing lines DL of a uniform focus depth of the laser beam 18b in the surface of the wafer W.

The height of surface of the wafer W is measured while the X-Y state 7 is moving the wafer W, aligning measuring points, one after another, with the optical axis 5a of the laser displacement meter 5. The distance M1 measured at any measuring point can reflect not only the projections and depressions in, and the inclination of, the wafer surface, but also the projections and depression in, and the inclination of, the X-Y stage 7.

Even if the X-Y stage 7 has projections and depressions in its surface or the ball-screw mechanism is inclined, the distance M1 between the surface of the wafer W and the optical unit 45 can be set to a prescribed value by adjusting the height of the optical unit 45. It follows that the focal distance can be adjusted with high precision.

As indicated above, distance M1 is measured at two points on each scanning line for the laser process, and the surface inclination of the wafer W along the scanning line extending between these points is approximated to a straight line. Distance M1 between the surface of the wafer W and the optical unit 45 can therefore be set to the prescribed value by adjusting the height of the optical unit 45 if the wafer W warps or the ball-screw mechanism is inclined.

Distance M1 is measured at a few points. Therefore, it takes a shorter time to measure distance M1 and correct the height of the optical unit 45 than in the case where distance M1 is measured at many points on each scanning line. This can prevents a decrease in throughput.

Once the wafer W is moved, aligning a measuring point P with the optical axis 5a of the laser displacement meter 5, the measuring point P at which distance M1 should be measured next is close to the first-mentioned point P. The distance that the wafer W must be moved by the drive mechanism is short.

Figure 12A:
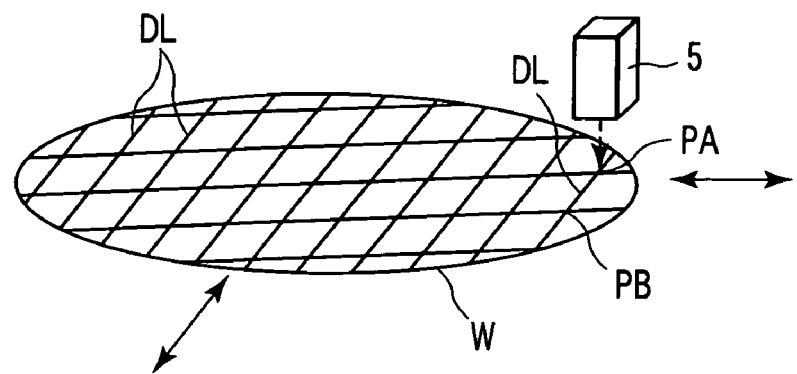
FIGS. 12A, 12B and 12C are perspective views explaining a method of measuring the surface displacement of a wafer, each view showing the wafer and a displacement meter.
Figure 12B:
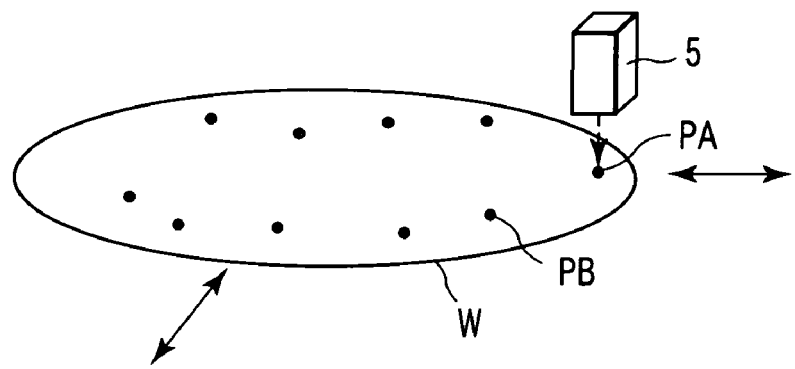

The height of surface of the wafer W may be measured by another method as is illustrated in, for example, FIG. 12A. The X-Y stage 7 moves the wafer W, causing the laser beam 18a coming from the laser displacement meter 5 to scan the wafer W along the scanning line DL. Distance M1 is measured at two points PA and PB or at more points, thereby determining the surface heights that the wafer W has at these points. Then, a height map of the wafer surface may be generate from the surface heights thus determined and the position data items about the points PA and PB.

Figure 13:
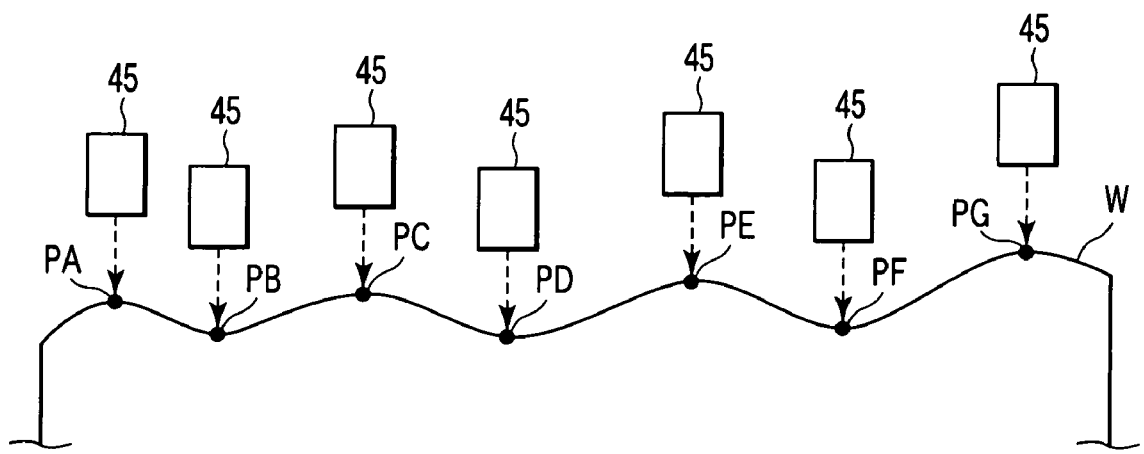
FIG. 13 is a side view explaining another method of correcting the height of the optical unit.

In this case, the height of the optical unit 45 is corrected at each measuring point P in accordance with the height map. As a result, the optical unit 45 remains at the same height, at many measuring points PA, PB, PC, PD, PE, PF and PG, as is illustrated in FIG. 13. This can enhance the efficiency of the laser process, uniformly over the entire surface of the wafer W.

The height of surface of the wafer W may be measured by still another method as is illustrated in 12B. The X-Y stage 7 moves the wafer W, causing the laser beam 18a coming from the laser displacement meter 5 to scan the wafer W at desired measuring points PA, PB, . . . . Distance M1 is measured at these points, thereby determining the surface heights that the wafer W has at these points. Then, a height map of the wafer surface is generated from the surface heights thus determined and the position data items about the points PA and PB. In accordance with the height map thus generated, the height of the laser displacement meter 5 may be adjusted. In this case, too, the height of surface of the wafer W is measured at many points. The optical unit 45 therefore remains at the same height, at many measuring points. This can enhance the efficiency of the laser process, uniformly over the entire surface of the wafer W.

Figure 12C:
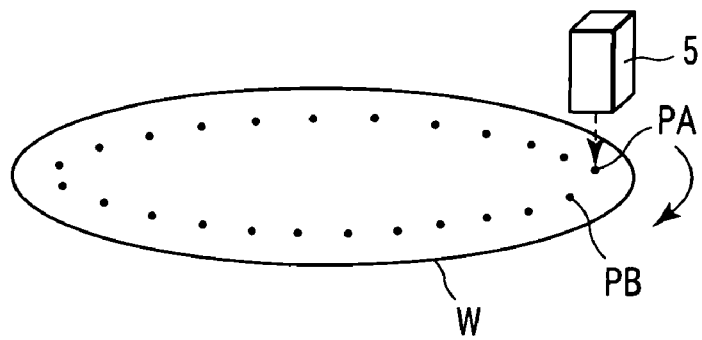

Alternatively, as FIG. 12C shows, the laser displacement meter 5 may be so positioned that the laser beam 18a may illuminate the wafer W at a point spaced about 2 mm from the circumferential edge of the wafer W. Then, the chuck 2 may be rotated, thus rotating the wafer 2 held by the chuck 2. Distance M1 between the wafer W and the optical unit 45 is measured at prescribed points PA and PB, thereby determining the heights of surface that the wafer W has at the measuring points PA and PB. A height map of the wafer surface is generated from the surface heights thus determined and the position data items about the points PA and PB. In accordance with the height map thus generated, the height of the laser displacement meter 5 may be adjusted. In this case, the measuring points PA and PB may be those spaced apart in the circumferential direction of the wafer W or those lying on a scanning line DL. On the basis of distances M1 measured at the points PA and PA, the surface inclination of the wafer W along the scanning line DL is determined. The surface inclination thus determined is approximated to a straight line, from which a height map may be generated.

Second Embodiment

A second embodiment of this invention will be described, with reference to FIG. 14.

In the second embodiment, the laser displacement meter 5 and the half-mirror 51 are so positioned that the laser displacement meter 5 has its optical axis 5a lies in front of the axis 17 of the laser beam 18b, with respect to the process direction of the arrow shown in FIG. 14. Except for this point, the second embodiment is identical in structure to the first embodiment. The term "process direction" means the direction in which spot of the laser beam 18b moves on the surface of the wafer W.

As in the first embodiment described above, the wafer W is transferred to the chuck 2 and set in a desired position, and the laser process is carried out, while adjusting the height of the optical unit 45. More precisely, the X-Y stage 7 moves the wafer W until the dicing-starting point on the wafer W comes into alignment with the optical axis 17 of the laser unit 4.

Subsequently, the support arm 60 moves the liquid-supplying nozzles 61 and 62, liquid-guiding member 63 and recovering nozzle 64a from the standby position to a predetermined position near the surface of the wafer W. Then, the liquid-supplying nozzles 61 and 62 supply liquid (e.g., pure water) to the surface of the wafer W. A water film (liquid film) is thereby formed on the wafer W.

A distance-measuring laser beam 18a for processing the wafer W is applied to the surface of the wafer W through the water film. Distance M2 is measured from the beam reflected the wafer W. In accordance with distance M2, the lift mechanism 47 is controlled, which adjusts the height (distance M1) of the optical unit 45 to an appropriate value. In the mean time, the laser unit 4 emits a wafer-processing laser beam 18b to the surface of the wafer W and X-Y stage 7 moves the chuck 2 in the Y-direction.

To be more specific, the distance-measuring laser beam 18a travels in front of the wafer-processing laser beam 18b as shown in FIG. 14. Distance M2 is thereby measured at a measuring point PA at a prescribed time. The data representing distance M2 is output right away to the control unit 8. The control unit 8 calculates, from the data, a correction value by which to correct distance M1 and generates a correction signal that represents the correction value. The correction signal is supplied to the controller 47a of the lift mechanism 47. In accordance with the correction signal, the lift mechanism 47 corrects the height of the optical unit 45 until the spot of the wafer-processing laser beam 18b moves from a point PN to the measuring point PA. The wafer-processing laser beam 18b is therefore focused, accurately at the measuring point PA.

In this embodiment, the height of surface of the wafer W is measured at a prescribed time during the laser process, and the height of the optical unit 45 is adjusted in real time on the basis of the height of surface thus measured. Hence, no time needs must be spent to measure the height of surface of the wafer W. This prevents a decrease in throughput. In addition, the optical unit 45 can remain at the same distance, M1, from the surface of the wafer W because the height of the unit 45 is adjusted in real time on the basis of the surface height measured. In other words, the optical unit 45 is at the same height, at many measuring points. This enhances the uniformity of laser process, over the entire surface of the wafer W. More-over, the distance M1, which has been measured during the laser process, can reflect not only the projections and depressions on and in the wafer surface, but also the projections and depression in and on the X-Y stage 7.

Third Embodiment

A third embodiment of this invention will be described, with reference to FIG. 15. The components identical to those of the first and second embodiments will not be described.

The third embodiment has an additional laser displacement meter 9 for detecting the depth of a recess made in the surface of the wafer W during the laser process. The laser displacement meter 9 is emits a distance-measuring laser beam 18c to the wafer W. The laser displacement meter 9 may be so positioned that the laser beam 18c travels at the back of the axis 17 of the wafer-processing laser beam emitted from the laser source 41.

In the present embodiment, the laser displacement meter 9 emits a distance-measuring laser beam 18c immediately after a wafer-processing laser beam 28b is applied to processing point PN. The surface of the wafer W reflects the distance-measuring laser beam 18c. From the laser beam 18c reflected, the depth of the recess formed in the surface of the wafer W. If the depth detected falls within a preset range, the laser process is continued. If the depth falls outside the preset range, an alarm device (not shown) generates an alarm under the control of the control unit 8. The lower limit of the present range is about ±1 μm less than the target value, and the upper limit of the p1 μm greater than the target value. The laser displacement meter 9 for detecting the depth of the recess may be used in the laser processing apparatus shown in FIG. 2.

If the depth of the recess falls outside the present range, the laser process is immediately performed again to make a recess having a desired depth. This ensures a high-precision laser process.

As can be understood from the foregoing, the present invention can be applied to not only dicing, but also other laser processes such as marking and mask repairing.

In the present invention, the height of surface of a substrate is measured before the laser process is performed on the wafer, and the height of the optical unit is adjusted in accordance with the height thus measured. As a result, the optical unit remains at the same height, at many measuring points on the substrate. Thus, the laser beam 18b is focused at all measuring points on the surface of the substrate, and the laser beam 18b is uniformly applied on the surface of the substrate. This enhances the uniformity of laser process, over the entire surface of the substrate.

What is claimed is:

1. A laser processing apparatus in which liquid is supplied to a surface of a substrate held in a horizontal position by a substrate-holding unit, forming a film of liquid on the surface, and a processing laser beam is applied to the surface through the film of liquid, thereby cutting and removing a part of a surface region of the substrate, said apparatus comprising:
   a light-applying section which has a laser source that emits the processing laser beam and a focusing unit that focuses the processing laser beam on the surface of the substrate held by the substrate-holding unit;
   a drive mechanism which moves the substrate-holding unit and the light-applying section relative to each other so as to move the substrate to align an axis of the processing laser beam with a point on the surface of the substrate;
   a lift mechanism which moves the focusing unit up from or, down toward, the surface of the substrate held by the substrate-holding unit;
   height-map acquiring means having a first laser displacement meter which applies a first distance-measuring laser beam to the surface of the substrate, thereby to measure a height of the surface of the substrate, and having a second laser displacement meter which applies a second distance-measuring laser beam at a back of the processing beam, thereby to detect the second distance-measuring laser beam reflected from the surface of the substrate and determines a depth to which the surface region of the substrate has been cut and removed with the processing laser beam, and configured to measure distances between the focusing unit and a plurality of points on the surface of the substrate held by the substrate-holding unit and acquire, from the distances measured, a height map of the surface of the substrate; and
   a control unit which sets a plurality of measuring points on the surface of the substrate, causes the drive mechanism to move the substrate, thereby to align each measuring point with an axis of the first distance-measuring laser beam, causes the first laser displacement meter to apply the first distance-measuring laser beam to each measuring point and to measure the height of the surface of the substrate at each measuring point, and causes the lift mechanism to move the focusing section, thereby to correct the distance between the focusing unit and the surface of the substrate, causes the light-applying section to emit the processing laser beam, thereby to cut and remove a part of the surface region of the substrate, and causes the second laser displacement meter to measure the depth of which the surface region of the substrate has been cut and removed with the processing laser beam.

2. The apparatus according to claim 1, wherein the measuring points exist on a scanning line scanned with the processing laser beam and includes two points which are at a peripheral surface of the substrate.

3. The apparatus according to claim 1, wherein the measuring points exist on a scanning line scanned with the processing laser beam and includes two points which are at a peripheral surface of the substrate.

4. The apparatus according to claim 3, wherein the height-map acquiring means obtains a straight line from the heights of surface of the substrate, which have been measured at the two measuring points, and generates a height map of the substrate surface from the straight line that is approximate to an inclination of the substrate surface.

5. The apparatus according to claim 3, wherein the substrate is shaped like a disc, the measuring points exist at the peripheral surface of the substrate, the drive mechanism moves the substrate-holding unit in X-direction and Y-direction in a two dimensional plane, the map-acquiring means has a first laser displacement meter which applies a first distance-measuring laser beam to the surface of the substrate, thereby to measure the height of surface of the substrate, and the control unit controls the drive mechanism, thereby to align the measuring points, one after another, with an axis of the first distance-measuring laser beam.

6. The apparatus according to claim 1, wherein the map-acquiring means has a first laser displacement meter which applies a first distance-measuring laser beam to the surface of the substrate, thereby to measure the height of surface of the substrate, and the first distance-measuring laser beam is coaxial with the processing laser beam.

7. The apparatus according to claim 1, wherein the height-map acquiring means has a first laser displacement meter which applies a first distance-measuring laser beam to the surface of the substrate, thereby to measure the height of surface of the substrate, and the first distance-measuring laser beam has an axis in front of an axis of the processing laser beam.

8. The apparatus according to claim 7, wherein the control unit controls the lift mechanism in accordance with the height map of the substrate surface, thereby to correct the height of the focusing unit, before the light-applying section applies the processing laser beam to one measuring point.

9. The apparatus according to claim 1, wherein the control unit sets a threshold value for the depth and generates an alarm when the surface region is processed to a depth greater than the threshold value.

10. A laser processing method in which liquid is supplied to a surface of a substrate held by a substrate-holding unit, forming a film of liquid on the surface, a laser beam emitted from a laser source is focused by a focusing unit on the surface of the substrate, the processing laser beam being applied through the film of liquid to the surface of the substrate, thereby cutting and removing a part of a surface region of the substrate, said method comprising:
  (a) acquiring a height map of the surface of the substrate by setting a plurality of measuring points on the surface of the substrate held by the substrate-holding unit, by moving the substrate by a drive mechanism to align each measuring point with an axis of a first distance-measuring laser beam, by applying the first distance-measuring beam to each measuring point by a first laser displacement meter, and by measuring a height of the surface of the substrate at the measuring points;
  (b) correcting a distance between the focusing unit and the surface of the substrate, by moving the focusing unit up or down by a lift mechanism in accordance with the height map acquired; and
  (c) cutting and removing a part of the surface region of the substrate by positioning the focusing unit at the corrected distance and by applying the processing laser beam to the measuring points by the laser source, and measuring a depth to which the surface region of the substrate has been cut and removed with the processing laser beam by applying a second distance-measuring beam to each measuring point by a second laser displacement meter at a back of the processing laser beam and by detecting the second distance-measuring laser beam reflected from the surface of the substrate.

11. The method according to claim 10, wherein, in the step (a), the measuring points exist on a scanning line scanned with the processing laser beam and includes two points which are at a peripheral surface of the substrate.

12. The method according to claim 10, wherein, in the step (a), a straight line is obtained from the heights of surface of the substrate, which have been measured at the two measuring points, and a height map of the substrate surface is generated from the straight line, said straight line being approximate to an inclination of the substrate surface.

13. The method according to claim 10, wherein the measuring points exist at a peripheral surface of the substrate, and the drive mechanism is controlled in the step (a), thereby to align the measuring points, one after another, with an axis of the first distance-measuring laser beam.

14. The method according to claim 10, wherein, in the step (c), a threshold value is set for the depth and an alarm is generated when the surface region is processed to a depth greater than the threshold value.

15. A laser processing method which is designed for use in a laser processing apparatus comprising a substrate-holding unit, a light-applying section having a laser source for emitting a processing laser beam and a focusing unit for focusing the processing laser beam on a surface of a substrate held by the substrate-holding unit, a first laser displacement meter for applying a first distance-measuring laser beam to the surface of the substrate to measure a height of the surface of the substrate, and a second laser displacement meter for measuring a depth to which a surface region of the substrate has been cut and removed by applying a second distance-measuring laser beam to the surface of the substrate, in which the processing laser beam and the first distance-measuring laser beam are simultaneously applied to the surface of the substrate, thereby to cut and remove a part of the surface region of the substrate, said process comprising:
  (i) setting a plurality of measuring points on the surface of the substrate, moving the substrate by a drive mechanism, thereby to align each measuring point with an axis of the first distance-measuring laser beam, causing the first laser displacement meter to apply the first distance-measuring laser beam to each measuring point and to measure the height of the surface of the substrate at each measuring point;
  (ii) correcting the height of the focusing unit in accordance with the height map of the substrate surface before the light-applying section applies the processing laser beam to the measuring point; and
  (iii) cutting and removing a part of the surface region of the substrate by positioning the focusing unit at the corrected distance and by applying the processing laser beam to the measuring points by the laser source, and measuring a depth to which the surface region of the substrate has been cut and removed with the processing laser beam by applying the second distance-measuring beam to each measuring point by the second laser displacement meter at a back of the processing laser beam and by detecting the second distance-measuring laser beam reflected from the surface of the substrate.

* * * * *